United States Patent [19]

Koon et al.

[11] 4,375,372

[45] Mar. 1, 1983

[54] USE OF CUBIC RARE EARTH-IRON LAVES PHASE INTERMETALLIC COMPOUNDS AS MAGNETOSTRICTIVE TRANSDUCER MATERIALS

[75] Inventors: Norman C. Koon, Alexandria, Va.; Albert I. Schindler, Silver Spring, Md.

[73] Assignee: The United States of America as represented by the Secretary of the Navy, Washington, D.C.

[21] Appl. No.: 235,410

[22] Filed: Mar. 16, 1972

[51] Int. Cl.³ .............................................. C22C 33/00
[52] U.S. Cl. ................................ 75/123 E; 148/31.57; 148/103; 310/26; 420/416
[58] Field of Search ..................... 148/31.57, 101, 103, 148/105, 31.55; 75/84, 152, 213, 170, 123 E; 340/870.3; 310/26

[56] References Cited

U.S. PATENT DOCUMENTS

| | | | |
|---|---|---|---|
| 2,829,047 | 1/1958 | Round et al. | 75/170 |
| 3,102,002 | 8/1963 | Wallace et al. | 75/152 |
| 3,421,889 | 1/1969 | Ostertag et al. | 75/170 |
| 3,424,578 | 1/1969 | Strnat et al. | 75/213 |
| 3,582,408 | 6/1971 | Onyshkevych | 148/31.55 |

FOREIGN PATENT DOCUMENTS 752317 7/1956 United Kingdom ............. 148/31.57

OTHER PUBLICATIONS

Wernick, J. et al.; *Rare-Earth Compounds with MqCu₂ Structure*, in Trans. AIME, 218, Oct. 1960, pp. 866–868.

*Primary Examiner*—John P. Sheehan
*Attorney, Agent, or Firm*—Robert F. Beers; William T. Ellis

[57] ABSTRACT

A magnetostrictive device capable of large magnetostrictive strains is produced from $RFe_2$ compounds wherein R is a rare earth element.

6 Claims, 1 Drawing Figure

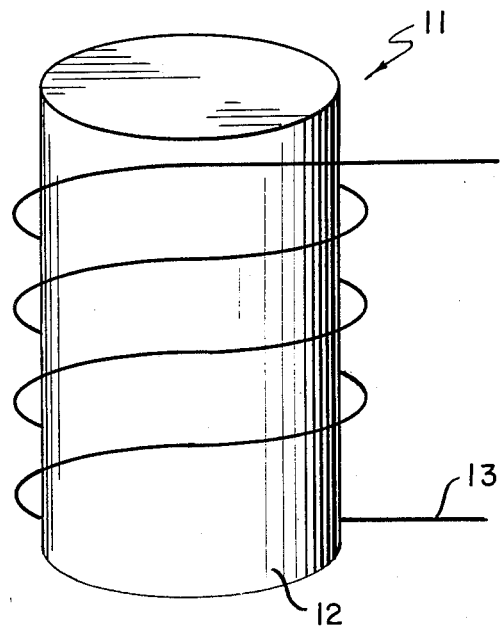

USE OF CUBIC RARE EARTH-IRON LAVES PHASE INTERMETALLIC COMPOUNDS AS MAGNETOSTRICTIVE TRANSDUCER MATERIALS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Two types of acoustic transducers commonly used today are piezoelectric and magnetostrictive. Because of their high electromechanical coupling coefficient, piezoelectric materials have been used for most high power, broadband applications. The use of piezoelectric materials is limited, however, because they are fragile and tend to deteriorate with use. Because of their ruggedness, it would be advantageous to produce transducers from magnetostrictive metals in lieu of piezoelectric materials. A magnetostrictive metal can be used as a transducer because such a material will undergo mechanical motion when subjected to a magnetic field. In other words, electromagnetic energy can be converted to mechanical energy. For example, if magnetostrictive material shaped as a rod having the length 1 is subjected to a magnetic field, the length of the rod will change from 1 to $1+\Delta 1$. Conversely, any change in length will cause a change in the intensity of the magnetic field. For this reason magnetostrictive devices are useful as acoustic transducers in SONAR systems.

To be useful in high power, broadband applications, the change in length, $\Delta 1$, must be large while the magnetocrystalline anisotropy coefficient is low. In order to normalize any measurements made of $\Delta 1$, such measurements are merely divided by the length of the rod, 1. $\Delta 1/1$ is known as the magnetostrictive strain, $\lambda$, of the material. When the material is placed in a saturation magnetic field, $\Delta 1/1$ is known as the saturation magnetostrictive strain, $\lambda_s$.

Past efforts to produce better magnetostrictive materials have centered primarily on the 3d transition metal alloy systems Ni-Co-Cr, Fe-Co and Fe-Al. $\lambda_s$ for these materials is about $150 \times 10^{-6}$ with very low anisotropy. This invention relates to the formation of magnetostrictive devices from materials capable of similar or even larger magnetostrictive strains than that of current materials being used.

SUMMARY OF THE INVENTION

This invention relates to magnetostrictive materials having large magnetostrictive strains. More specifically, the invention is directed towards the use of cubic rare-earth iron Laves phase compounds in magnetostrictive transducers.

OBJECTS OF THE INVENTION

It is an object of this invention to provide compositions from which magnetostrictive devices can be produced.

Another object is to provide devices having large magnetostrictive strains.

A further object is to provide a method for converting electromagnetic energy to mechanical energy.

Other objects, advantages and novel features of the invention will become apparent from the following detailed description of the invention when considered in conjunction with the accompanying drawing wherein:

BRIEF DESCRIPTION OF THE DRAWING

The FIGURE discloses a magnetostrictive device consisting of a magnetostrictive element and a coil to produce a magnetic field.

DETAILED DESCRIPTION

The invention relates to the use of rare earth elements to produce magnetostrictive elements, 12. The elements can be used in magnetostrictive devices, 11, such as transducers, by surrounding the element, 12, with a coil, 13, or any other means that will provide a magnetic field within said element.

The device can then be used to convert electromagnetic energy to mechanical energy by subjecting element, 12, to a magnetic field produced by coil, 13. When the magnetic field is applied to element 12 said element will undergo a change in size.

The element 12 is produced from rare earth compounds having the general formula $RFe_2$, where R is a rare earth element. Useful rare earth elements are Tb, Dy, Ho and Er.

The elements can be prepared in polycrystalline form by either arc melting or by induction melting of the rare earth components in recrystallized alumina crucibles in both cases under an argon atmosphere. After melting the alloy ingots can be annealed if desired.

Magnetostrictive strain measurements of the $RFe_2$ elements were taken by cutting the ingots into thin discs and using a threeterminal capacitance technique. At room temperature and in a magnetic field of 17.5 kOe the following results were obtained.

| Composition | $\lambda$ |
| --- | --- |
| $TbFe_2$ | $11 \times 10^{-4}$ |
| $DyFe_2$ | $2.5 \times 10^{-4}$ |
| $HoFe_2$ | $0.8 \times 10^{-4}$ |
| $ErFe_2$ | $-1 \times 10^{-4}$ |

It should be noted that only $ErFe_2$ was magnetically saturated. It is expected that the other compositions will exhibit even larger magnetostrictive strains when magnetically saturated. From the above results it can be seen that the use of these rare earth compounds provide larger magnetostrictive strains than were previously obtained. Therefore, when magnetostrictive elements, 12, formed of these compounds are subjected to a magnetic field, the mechanical motion or change in size evolved is greater than that achieved in the past.

Magnetostrictive strain measurements were also taken in ternary compounds having the formula $R'_x R''_{(1-x)} Fe_2$, where $R'$ and $R''$ are different rare earth elements and x is a number between 0 and 1. When $Ho_{0.9}Tb_{0.1}Fe_2$ was measured the saturation magnetostrictive strain was about $150 \times 10^{-6}$ while the magnetocrystalline anisotropy coefficient was relatively low. It is expected that by using ternary compounds such as, $Ho_xTb_{(1-x)}Fe_2$, and $Gd_xTb_{(1-x)}Fe_2$, an optimization of large magnetostrictive strain with low magnetocrystalline anisotropy can be achieved.

Other alternative compositions which may be useful in magnetostrictive devices include $RFe_3$ and $TbFe_{(2-x)}Ni_x$ where R is a rare earth element and x is a number between 0 and 1. It is expected that the $RFe_3$ compounds will yield large magnetostrictive strains while $TbFe_{(2-x)}Ni_x$ will yield both large magnetostrictive strains and low anisotropy.

Obviously many modifications and variations of the present invention are possible in the light of the above teachings. It is therefore to be understood that within the scope of the appended claims the invention may be practiced otherwise than as specifically described.

What is claimed and desired to be secured by Letters Patent of the United States is:

1. A method of converting electromagnetic energy to mechanical energy which comprises subjecting a magnetostrictive compound represented by the formula $R'_xR''_{(1-x)}Fe_2$ wherein R' and R" are different rare earth elements and are selected from the class consisting of holmium, erbium, and dysprosium and x ranges from 0 to 1, said compound being formed into a magnetostrictive device element, to a variation in magnetic field, whereby mechanical energy is produced in the form of a change in physical size of said magnetostrictive compound.

2. The method for converting electromagnetic energy to mechanical energy of claim 1 wherein x equals 1.

3. A magnetostrictive compound having the formula $RFe_3$ wherein R is a rare earth selected from the class consisting of holmium, erbium, dysprosium.

4. The magnetostrictive compound of claim 3 having the formula $RFe_3$ wherein R is dysprosium.

5. The magnetostrictive compound of claim 3 having the formula $RFe_3$ wherein R is holmium.

6. The magnetostrictive compound of claim 3 having the formula $RFe_3$ wherein R is erbium.

* * * * *